United States Patent
Huang et al.

(10) Patent No.: US 10,331,919 B2
(45) Date of Patent: Jun. 25, 2019

(54) RADIOFREQUENCY IDENTIFICATION MANAGEMENT OF SERVER COMPONENTS

(71) Applicant: QUANTA COMPUTER INC., Taoyuan (TW)

(72) Inventors: Chih-Chia Huang, Taoyuan (TW); Chin-Lung Su, Taoyuan (TW); Hao-Yu Chan, Taoyuan (TW); Ming-Chih Hsiao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/788,544

(22) Filed: Oct. 19, 2017

(65) Prior Publication Data

US 2019/0122015 A1 Apr. 25, 2019

(51) Int. Cl.
*G06K 7/08* (2006.01)
*G06K 7/10* (2006.01)

(52) U.S. Cl.
CPC ..... *G06K 7/10356* (2013.01); *G06K 7/10475* (2013.01)

(58) Field of Classification Search
CPC ............... G06K 7/10356; G06K 7/10475
USPC .......................................... 235/451, 383, 385
See application file for complete search history.

(56) References Cited

U.S. PATENT DOCUMENTS

| | | |
|---|---|---|
| 2007/0055470 A1 | 3/2007 | Pietrzyk et al. |
| 2007/0250410 A1 | 10/2007 | Brignone et al. |
| 2011/0047263 A1 | 2/2011 | Martins et al. |
| 2011/0248823 A1 | 10/2011 | Silberbauer et al. |
| 2013/0241699 A1* | 9/2013 | Covaro ............ G06K 7/10009 340/10.1 |
| 2014/0306017 A1 | 10/2014 | Hansen et al. |
| 2015/0206094 A1 | 7/2015 | Hayes et al. |
| 2017/0091607 A1* | 3/2017 | Emeis ................... G06T 19/006 |

FOREIGN PATENT DOCUMENTS

| | | |
|---|---|---|
| TW | 200939140 A | 9/2009 |
| WO | 2013095414 A1 | 6/2013 |

OTHER PUBLICATIONS

TW Office Action for Application No. 107110688, dated Nov. 29, 2018, w/ First Office Action Summary.
TW Search Report for Application No. 107110688, dated Nov. 29, 2018, w/ First Office Action.
Extended European Search Report for EP Application No. 18176414.3, dated Dec. 21, 2018.

* cited by examiner

*Primary Examiner* — Karl D Frech
(74) *Attorney, Agent, or Firm* — Nixon Peabody LLP; Zhou Lu

(57) ABSTRACT

Methods and apparatuses are disclosed for managing components within a server using radiofrequency communications. The methods and apparatuses disclosed employ a server having a chassis with a plurality of slots. Each slot of the plurality of slots is configured to connect a removable electronic component to the chassis. The server also includes a controller configured to manage the removable electronic components connected to the chassis. The server also includes at least one RFID reader communicatively connected to the controller. The at least one RFID reader is configured to interrogate one or more RFID tags of the removable electronic components connected to the chassis and provide information from the one or more RFID tags to the controller.

20 Claims, 11 Drawing Sheets

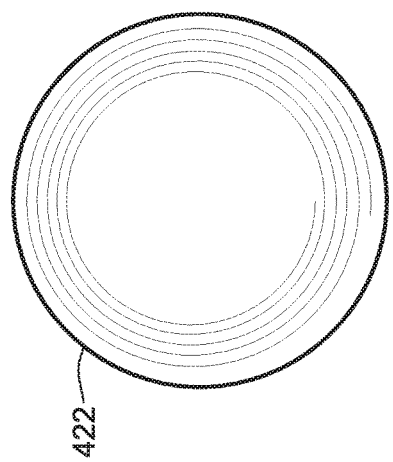
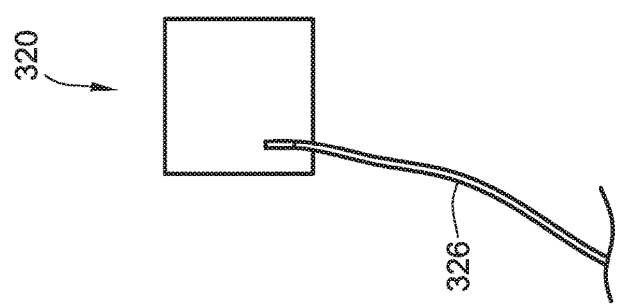

(continiued)

RADIOFREQUENCY IDENTIFICATION MANAGEMENT OF SERVER COMPONENTS

FIELD

The present disclosure relates to the management of electronic components within a server, and more specifically to apparatuses and methods for managing the electronic components via radiofrequency communication.

BACKGROUND

Servers are built for flexibility by providing for the addition and removal of electronic components depending on the particular requirements of the servers. Such removable electronic components include, for example, one or more fans, one or more power supply units (PSUs), one or more graphics processing units (GPUs), one or more memories, etc.

Currently, some of the electronic components within a server can communicate with one or more controllers of the server. These electronic components can be referred to as active electronic components and include, for example, PSUs, GPUs, and memories. In contrast, some of the electronic components within a server cannot communicate with the one or more controllers. These electronic components can be referred to as passive electronic components and include, for example, fans.

One solution for allowing passive electronic components to communicate with one or more controllers is modifying the existing connector interfaces, both on the components themselves, and on the circuit boards to which they connect, so as to be communicative with a controller.

FIG. 1 shows of a server 100 configured so that all of the electronic components can communicate with a controller. However, the configuration of the server 100 includes several drawbacks. The server 100 consists of a chassis 102 having a circuit board 104, such as a motherboard or other main board, disposed therein. The chassis 102 also includes components 106 and 108 insertable into one or more slots (not shown) within the chassis 102. As illustrated in FIG. 1, the components 106 correspond to passive electronic components, such as one or more fans or fan trays, including one or more fans. The components 108 correspond to active electronic components, such as one or more PSUs. However, the components 106 and 108 can be any type of removable electronic components that can be added to the chassis 102, such as any type of field-replaceable unit (FRU) or hot-swappable unit.

The components 106 and 108 can be electrically connected to the circuit board 104 via connectors 110 and 112, which include for example, a male connector 110a, 112a on the components 106 and 108, and a female connector 110b, 112b on the circuit board 104. The connectors 110 and 112 allow the components 106, 108 to be communicatively connected to a controller 114 and other components disposed on the circuit board 104.

While conventional connectors (e.g., the connectors 112) for active components 108 already include additional pin connections for the communication of signals between the active electronic components 108 and the controller 114, conventional connectors (e.g., the connectors 110) for the passive components 106 do not include the additional pin connections. Conventional passive electronic components also typically do not have the required printed circuit board assembly (PCBA) for connecting to the controller 114. Thus, the connectors 110 of FIG. 1 have been modified relative to conventional connectors for passive components, to include additional pins to allow for the communication of signals between the components 106 and the controller 114 for management and control of the components 106 by the controller 114. However, modification of the connectors 110 requires additional space on the circuit board 104 and additional space within the chassis 102, which could otherwise be used with other additional components. The consumed space and addition of wires for the modified connectors also restrict airflow within the server 100. Further, the additional pins make the components 106 not backwards compatible with current connectors on current circuit boards. Thus, the arrangement shown in FIG. 1 has drawbacks despite the ability for the controller 114 to communicatively connect to the passive electronic components.

FIG. 1 also illustrates an asset identification component 116 that can be inserted into the server 100 (e.g., inserted into the chassis 102). The asset identification component 116 allows for the manual identification of assets (e.g., components, such as the electronic components 106 and 108, controllers, memories, modules, and other units) within the server 100. However, as illustrated by the X in FIG. 1, the controller 114 is not communicatively connected to the asset identification component 116. Rather, the asset identification component 116 is present merely for an operator to optically scan a bar code, two-dimensional code, or other type of visible indicia associated with a scheme for identifying the assets within the server 100. The manual process of scanning the codes is inefficient, and the codes themselves are fixed and cannot be dynamically changed. The scheme of the codes also limits the amount of information that can be stored on the asset identification component 116. Thus, the asset identification component arrangement in FIG. 1 has drawbacks on flexibility and the amount of information that can be readily accessed concerning setup of the server.

Accordingly, there is a need for apparatuses and methods that overcome the foregoing drawbacks.

SUMMARY

The various embodiments concern apparatuses and methods for managing removable electronic components within a server using radiofrequency identification (RFID) readers and tags.

The various embodiments further concern apparatuses and methods for management of passive electronic components within a server by interrogating RFID tags on the passive electronic components.

For example, servers according to first embodiment have a chassis with a plurality of slots. Each slot of the plurality of slots is configured to connect a removable electronic component to the chassis. The server further includes a controller configured to manage utilization of the removable electronic components within the server and serve as an interface between the removable electronic components and an operating system of the server. The server further includes at least one radiofrequency identification (RFID) reader communicatively connected to the controller. The at least one RFID reader is configured to interrogate one or more RFID tags of the removable electronic components connected to the chassis, and provides information from the one or more RFID tags to the controller.

In some implementations, the at least one RFID reader is a plurality of RFID readers, and each RFID reader of the plurality of RFID readers is associated with a separate slot of the plurality of slots. Further, the server can include a plurality of antennas communicatively connected to the plurality of RFID readers. Each antenna of the plurality of antennas can be connected to a separate RFID reader of the plurality of RFID readers. Each antenna of the plurality of antennas can also be positioned at a separate slot of the plurality of slots, to be in alignment with the RFID tag of the electronic component connected to the separate slot.

In some implementations, the chassis can include an aperture configured to accept insertion of an asset identification component. The at least one RFID reader can be configured to interrogate an RFID tag of the asset identification component with the asset identification component inserted into the aperture. Further, the server can include at least one antenna communicatively connected to the at least one RFID reader. The at least one antenna can be positioned to be in alignment with the RFID tag of the asset identification component with the asset identification component inserted into the aperture. Further, the at least one RFID reader can be at least one RFID transceiver configured to provide information from the controller to the one or more RFID tags.

Servers, according to second embodiment, include a chassis comprising a plurality of slots, and a plurality of removable electronic components. Each removable electronic component of the plurality of removable electronic components can be inserted into a separate slot of the plurality of slots to connect the removable electronic component to the chassis and including an RFID tag. The server can also include a controller configured to manage utilization of the removable electronic components within the server; and serve as an interface between the removable electronic components and an operating system of the server, and a plurality of RFID readers communicatively connected to the controller. Each RFID reader of the plurality of RFID readers can be configured to interrogate a separate RFID tag of a separate removable electronic component of the plurality of electronic components, and provide retrieved information from the separate RFID tag to the controller.

In some implementations, the plurality of RFID readers can be a plurality of RFID transceivers configured to provide information from the controller to the plurality of RFID tags of the plurality of removable electronic components. Further, the server can include an aperture within the chassis configured to accept an asset identification component. The at least one RFID transceiver of the plurality of RFID transceiver can be configured to interrogate an RFID tag of the asset identification component, and provide information from the RFID tag of the asset identification component to the controller. Further, the at least one RFID transceiver can be configured to write information from the controller in the RFID tag of the asset identification component.

Methods according to third embodiment involve managing one or more removable electronic components within a server. One particular method includes interrogating, with an RFID reader, an RFID tag of a removable electronic component of the one or more removable electronic components connected to a chassis of the server. The method further includes receiving, in response to the interrogating, information from the electronic component and providing, by the RFID reader, the information to a controller of the server. The method further includes managing, by the controller, the removable electronic component, the server, or a combination thereof based on the information.

In some implementations, the RFID reader is an RFID transceiver, and the managing of the removable electronic component includes causing an update to the information on the RFID tag.

In some implementations, the managing includes the controller causing a logging of the information in an electronic database external, internal, or a combination thereof, to the server.

In some implementations, the managing includes providing, by the server, the information for display on a graphical user interface of an electronic device. Further, the managing can include decoding the information for display on the graphical user interface, and the electronic device is a mobile electronic device.

In some implementations, the interrogating is continuous, periodic, on-demand, in response to insertion of the removable electronic component, or a combination thereof.

In some implementations, the information includes one or more operating parameters of the removable electronic component. Further, the information also includes a serial number, a model number, a part revision, an Internet Protocol address, a media access control address, a model name, a first run date, a last run date, a runtime, a manufacture date, a manufacturer, or a combination thereof of the removable electronic component.

In some implementations, the RFID reader can be an RFID transceiver. The method can further include interrogating an RFID tag of an asset identification component inserted into the server with the RFID transceiver. The method further can include causing an update of the RFID tag of the asset identification component based on the information by providing the information to the asset identification component.

BRIEF DESCRIPTION OF THE DRAWINGS

FIG. 3 illustrates an antenna that can be connected or integrated into an RFID reader, in accordance with the various embodiments.

FIG. 4 illustrates an RFID tag that can be incorporated into an electronic component, in accordance with the various embodiments.

DETAILED DESCRIPTION

Figure 1:
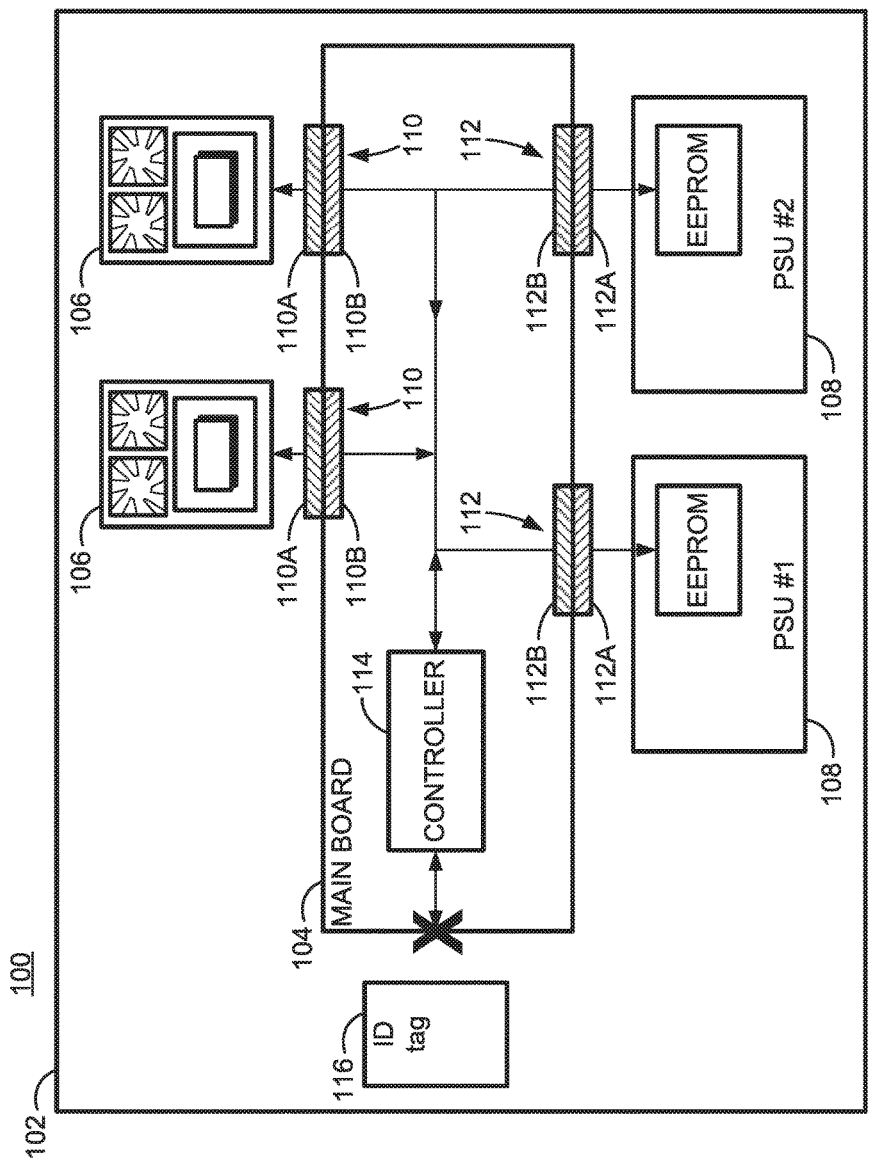
FIG. 1 illustrates a schematic diagram of a server configured for accepting removable electronic components that is useful for describing the various embodiments.

The various embodiments are described with reference to the attached figures, wherein like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the various embodiments.

To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

Although the various embodiments will be discussed primarily with respect to a fan or a fan tray as the passive electronic component, this is solely for ease of illustration. The apparatuses and methods discussed herein can be applied to any other type of removable electronic component within a server, including any type of passive and active electronic component.

As noted above, there are various disadvantages with current systems and methods related to managing electronic components within a server. Accordingly, the various embodiments provide an alternative to such systems and methods. In particular, the various embodiments utilize RFID readers and tags to communicate information between a controller providing the management within the server, and the components in a server being managed. This is schematically illustrated in FIG. 2.

Figure 2:
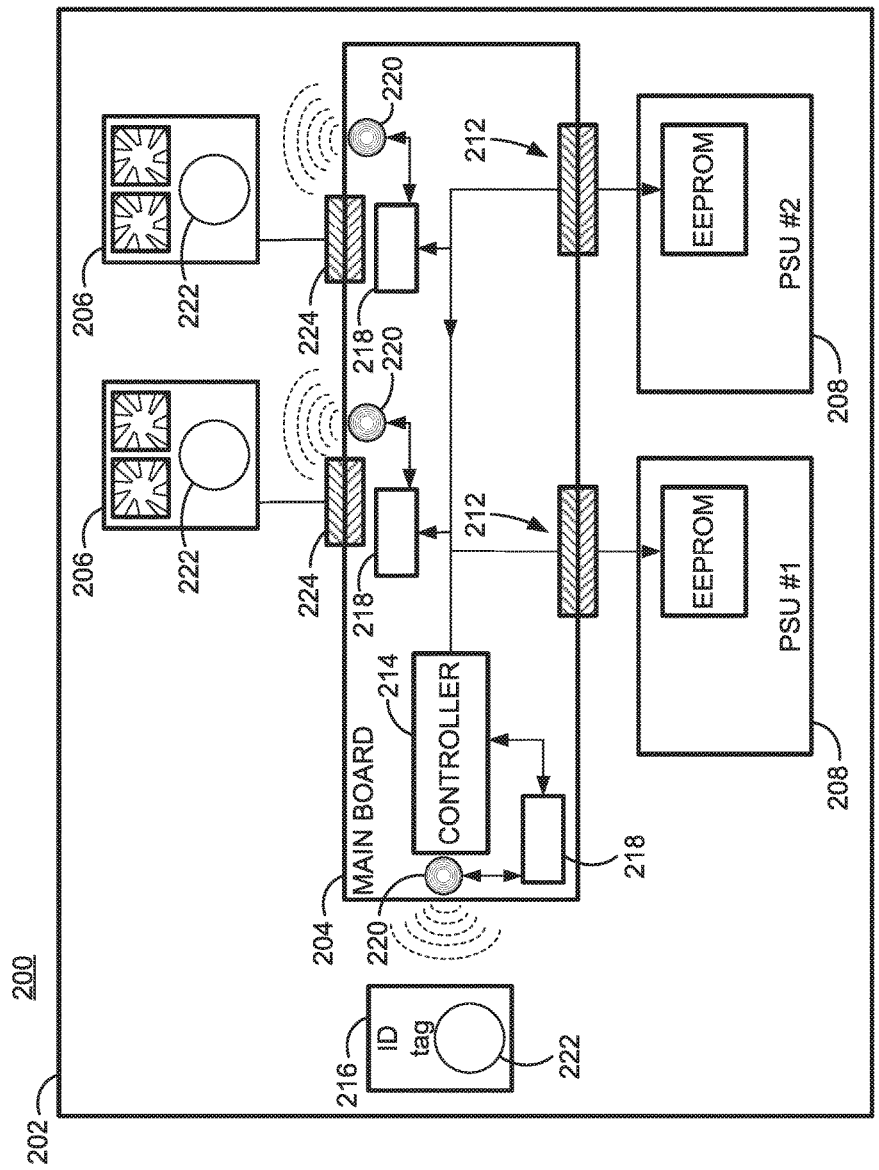
FIG. 2 illustrates a schematic diagram of an alternative server configured for accepting removable electronic components that are communicatively connected to a controller through radiofrequency communications, in accordance with the various embodiments.

FIG. 2 illustrates a schematic diagram of a server 200 configured for communicatively connecting removable electronic components to a controller through radiofrequency communications, in accordance the various embodiments. In particular, server 200 in FIG. 2 is substantially similar to that of server 100 in FIG. 1. Accordingly, the description of elements 102, 104, 106, 108, 112, 114, and 116 provided above with respect to FIG. 1 is sufficient for describing elements 202, 204, 206, 208, 212, 214, and 216 in FIG. 2, except as noted below.

The controller 214 can be, for example, a specialized microcontroller or processor within the server 200, such as a management controller (MC). The controller 214 can be configured to manage the utilization of the electronic components 206, 208 or any other asset or component within the server 200 within the server. The controller 214 also can be configured to serve as the interface between the electronic components 206, 208, or any other asset or component within the server 200, and the operating system of the server 200. In some embodiments, an exemplary management controller can be a baseboard management controller (BMC). In one or more embodiments, the controller 214 can be part of an Intelligent Platform Management Interface (IPMI) and can manage the interface between system management software and platform hardware independently of other controllers within the server 200, such as central processing units (CPUs).

As illustrated in FIG. 2, the server 200 includes RFID readers 218. The RFID readers 218 can be various different types of active RFID readers 218 based on various different protocols and standards, such as low-frequency standards (LF), high-frequency standards (HF), ultra-high-frequency standards (UHF), near field communication (NFC) standards, etc. The RFID readers 218 are communicatively connected to the controller 214, either directly or through a bus (e.g., power management bus (PMB), inter-integrated circuit ($I^2C$) bus, etc.). The type of RFID reader implemented, such as an LF, HF, or UHF reader, can vary depending on the distances over which the communication signals need to travel. Within the environment of a server chassis the distances are not great such that an LF, HF, and UHF RFID reader can be implemented. In one or more embodiments, the type of RFID reader implemented can also depend on the level of interference within the environment. For example, LF RFID readers suffer from less interference, and can therefore be preferred over HF and UHF RFID readers in environments with high levels of interference.

The RFID readers 218 also are communicatively connected to antennas 220. The antennas 220 can be integrated into the RFID readers 218 or be connected to the RFID readers 218 by a cable (FIG. 3). The antennas 220 are sized and configured according to the protocols and standards of the RFID readers 218, and according to the desired distances over which radiofrequency communication is desired. Low-frequency antennas use inductive coupling for communication, and are typically coiled or circular in shape. High-frequency antennas also use inductive coupling for communication, and are typically rectangular or circular in shape. Ultra-high-frequency antennas use backscatter coupling for communication and typically are dipole shaped. The shape of the antenna used can therefore vary depending on the type of RFID communication used, such as LF, HF, or UHF communication.

The RFID readers 218 interrogate RFID tags 222 on the electronic components 206 by sending an interrogation signal through the antennas 220. The RFID tags 222 are then configured to respond to the interrogation signal with a response signal. Although referred to generally as a tag, RFID tags 222 include both an antenna and typically a microchip (e.g., special-purpose controller). The antenna of the RFID tag 222 can be shaped according to the shapes described above for the antennas 220. The microchip can be any special-purpose microchip used in RFID tags.

In one or more embodiments, the RFID tags 222 can be passive tags such that the RFID tags 222 do not include their own battery or other power source. An outside power source, such as the antenna 220, activates the passive tag so that the tag sends a response signal. In particular, the antenna of the RFID tag 222 receives an interrogation signal from the antenna 220. The interrogation signal energizes the antenna of the RFID tag 222 and powers the microchip on the RFID tag 222, which then generates the response signal. The response signal includes information associated with the electronic component on which the RFID tag 222 is attached. This response signal can also include the information associated with the RFID tag 222 itself. An outside source, such as the RFID reader 218, can then read the response signal being sent by the RFID tag 222. The RFID reader 218 then communicates the response signal to a controller, such as the controller 214, which can then manage the electronic component associated with the RFID tag based on the information.

As an alternative to being passive, the RFID tags 222 can be semi-passive or active tags. Semi-passive tags include a battery that powers the tag, but otherwise does not have the requisite power to send a transmission signal to an antenna. Active tags include a power source that supports that tag powering up, as well as supports transmitting signals to an antenna. However, in particular embodiments, passive RFID tags can be used because they are more economical; and better suited for a server environment by requiring less space and less additional components (e.g., a battery) for operation.

Each RFID tag 222 can be configured to store information about the electronic component 206 associated with the RFID tag 222. The information can include, for example, one or more operating parameters of the electronic component 206. In the case of a fan as the electronic component 206, such operating parameters can be, for example, fan airflow direction, fan location within the server 200, fan rotor status, etc. The operating parameters can be other information specific to the type of electronic component 206. The information also can include generic information for electronic components 206, such as the serial number, model number, part revision, Internet Protocol address, media access control address, model name, first run date, last run date, runtime, manufacture date, manufacturer, or a combination thereof.

As shown in FIG. 2, there can be one RFID reader 218 and one antenna 220 for each electronic component 206, such as for each slot (not shown) in the chassis 202 where an electronic component 206 can be inserted. Alternatively, there can be a single RFID reader 218 for the server 200 and one antenna 220 for each electronic component 206, such as for each slot (not shown) in the chassis 202 where an electronic component 206 can be inserted. The single RFID reader 218 can discriminate between RFID tags 222 of the electronic components 206 based on information from the RFID tags 222, such as identification information specific to each RFID tag 222. Alternatively, there can be a single RFID reader 218 and single antenna 220 for the server 200, and the single RFID reader 218 can discriminate between RFID tags 222 of the electronic components 206 based on information from the RFID tags 222.

In addition to providing information to a controller (e.g., controller 214) within a server (e.g., server 200), a user assembling the server can interrogate an RFID tag associated with an electronic component prior to installing the electronic component. Interrogating the RFID tag allows the user to make sure that the electronic component is the correct component before installation within the server.

FIG. 2 also illustrates connectors 224 that connect the electronic components 206 to the circuit board 204. However, the connectors 224 can be conventional connection interfaces that provide, for example, power to the electronic components 206 and do not communicatively connect the electronic components 206 to the controller 214. Thus, the connectors 224 can have the standard, conventional number of pins for the connection. The connectors 224 take up less space than the connectors 110 of FIG. 1. Such space savings can be about 4 to 5 millimeters in cross-sectional space.

Although described as RFID readers 218, in one or more embodiments the RFID readers 218 can be configured as RFID transceivers. The RFID transceivers can write information to the RFID tags 222 of the electronic components 206 and/or the asset identification component 216. RFID transceivers allow for the information stored on the RFID tags 222, or even on the electronic components 206, to be updated. In one or more embodiments, the information written to the RFID tags 222 of the electronic components 206 can update the information already present. By way of example, the controller 214 can detect an error code for one or more modules within the server 200, and the controller 214 can instruct the RFID transceiver 218 to write the error codes to the RFID tag 222 of the asset identification component 216. In one or more embodiments, the controller 214 can instruct an RFID transceiver to write information to an RFID tag 222. The information written to the RFID tag 222 can be information that updates one or more operating parameters stored in memory of the electronic component 206. Updating the one or more operating parameters can then update the operation of the electronic component 206. In the case of a fan as the electronic component 206, changing an operating parameter can include, for example, the fan speed. Thus, the RFID readers 218 configured as the RFID transceivers allows the controller 214 to actively manage the asset identification component 216 and the electronic components 206, by both reading and writing information to the RFID tags 222 associated with the asset identification component 216 and the electronic components 206.

A specific example of the elements described and illustrated in FIG. 2 will now be described and illustrated with reference to FIGS. 3-7. The description with respect to FIGS. 3-7 is for explanation purposes only and is not meant to be limiting. Moreover, elements described and illustrated with respect in FIGS. 3-7 that are similar to the elements described and illustrated in FIG. 2 are similarly number. Thus, the description of the elements with respect to FIG. 2 is sufficient for describing the similarly numbered elements in FIGS. 3-7, except as noted otherwise below.

FIG. 3 illustrates an exemplary antenna 320 that can be communicatively connected to an RFID reader (e.g., RFID reader 218 in FIG. 2), in accordance with the various embodiments. The antenna 320 shown in FIG. 3 is for explanation purposes only and is not meant to be limiting. Antennas according to the various embodiments can have other shapes and sizes than the antenna 320 of FIG. 3 without departing from the spirit and scope of the disclosed embodiments. The antenna 320 illustrated in FIG. 3 includes a cable 326 that connects the antenna 320 to the RFID reader. However, in one or more embodiments, the antenna 320 does not require the cable 326, such as if the antenna 320 is integrated into the RFID reader.

As discussed above, the geometry and size of the antenna 320 can vary. The geometry and size can vary depending on the protocol and/or standard being used for the radiofrequency communication or the desired distance between the antenna 320 and an RFID tag (e.g., RFID tag 222 in FIG. 2). The geometry and size also can vary depending on whether there is a one-to-one relationship between the antenna 320 and the RFID tag or if more than one the RFID tag is interrogated by the antenna 320. However, in accordance with the illustrated embodiment, the antenna 320 can be in the shape of a square that is 2.5 cm tall and wide, as shown. As also shown, the antenna 320 can be thin, which results in less airflow restriction within a chassis of the server (e.g., chassis 202 and server 200 in FIG. 2) as compared to, for example, connectors 110 of FIG. 1.

FIG. 4 illustrates an RFID tag 422 of an electronic component (e.g., electronic component 206 in FIG. 2), in accordance with the various embodiments. The RFID tag 422 shown in FIG. 4 is for explanation purposes only and is not meant to be limiting. RFID tags according to the various embodiments can have other shapes and sizes than the RFID tag 422 of in FIG. 4 without departing from the spirit and scope of the disclosed embodiments. The geometry and size of the RFID tag 422 can vary based on the reasons discussed above with respect to the antenna 320 in FIG. 3. However, in accordance with the illustrated embodiment, the RFID tag 422 can be in the shape of a circle with a diameter of about 1.5 cm or a square that is 2.5 cm tall and wide.

The RFID tag 422 can be attached to the electronic component according to a variety of attachment configurations. For example, at least one or a combination of a clip, tie, or adhesive material can be utilized to attach the RFID tag 422 to the electronic component. The attachment can be used in such a way as to maintain, for example, the orientation and/or offset of the RFID tag 422 for the correct operation between the RFID tag 422 and the antenna 320 in FIG. 3, as an example. In particular, the RFID tag 422 can be at a specific orientation relative to the antenna 320 that is powering the RFID tag 422 via an interrogation signal in order to facilitate the correct operation of the RFID tag 422. For example, the RFID tag 422 can be oriented in an overlapping alignment with the antenna 320, such as an overlapping vertical arrangement with the antenna 320. The overlapping alignment allows the antenna 320 and the RFID tag 422 (or antenna within the RFID tag 422) to overlap. In one or more embodiments, the RFID tag 422 can be spaced at least a quarter-inch off of the antenna 320 vertically to reduce interference between an electronic component associated with the RFID tag 422 and the radiofrequency signal from the RFID tag 422.

Figure 5:
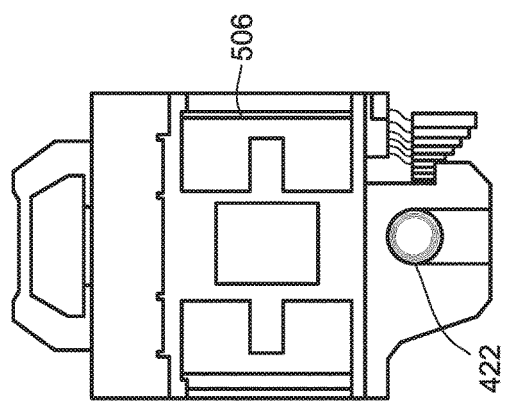
FIG. 5 illustrates an electronic component with an incorporated RFID tag, in accordance with the various embodiments.

FIG. 5 illustrates an electronic component 506 with the RFID tag 422 of FIG. 4, in accordance with the various embodiments. As illustrated, the electronic component 506 can be one or more fans or a fan tray that includes one or more fans. However, the electronic component 506 can be any type of described electronic component 506. As described further below, the RFID tag 422 is positioned on the electronic component 506 so as to be within communication range of an antenna (e.g., antenna 320 of FIG. 3) configured to interrogate the RFID tag 422. In one or more embodiments, the RFID tag 422 can be positioned on the electronic component 506 to align with an antenna when the electronic component 506 is inserted into a chassis (e.g., chassis 202 of FIG. 2). In one or more alternative embodiments, the RFID tag 422 can be positioned anywhere on the electronic component 506 that is within communication range of the antenna. For example, the RFID tag 422 can be offset from the antenna so that the RFID tag 422 and the antenna do not overlap. The RFID tag 422 can be exposed on the electronic component 506 or can be embedded within the electronic component 506, depending on the radiofrequency communication implemented within an associated RFID reader (e.g., RFID reader 218 in FIG. 2). As shown in FIG. 5, the RFID tag 422 is on the surface of a face of the electronic component 506.

Figure 6A:
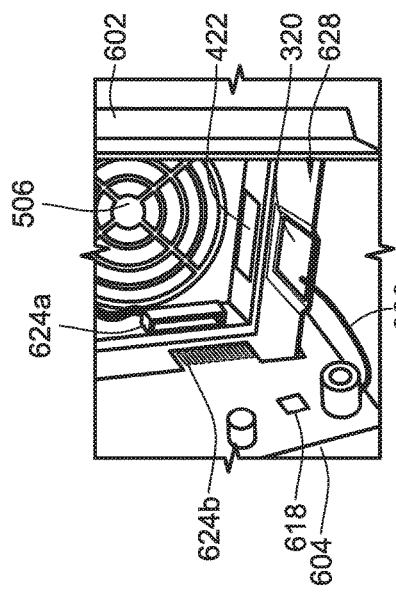
FIG. 6A illustrates an electronic component prior to insertion within a chassis of a server, in accordance with the various embodiments.
Figure 6B:
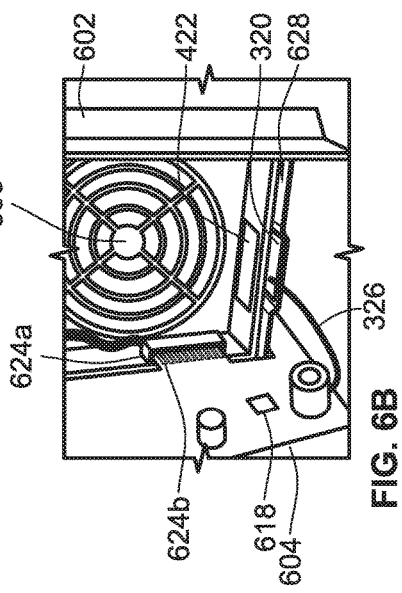
FIG. 6B illustrates the electronic component of FIG. 6A after insertion within a chassis of a server, in accordance with the various embodiments.

Referring now to FIGS. 6A and 6B, FIG. 6A illustrates the electronic component 506 (of FIG. 5) partially inserted into a slot 628 within a chassis 602 of a server 600, in accordance with the various embodiments. FIG. 6B illustrates the electronic component 506 (of FIGS. 5 and 6A) after being fully inserted into the slot 628, in accordance with the various embodiments.

As shown in FIG. 6A, the chassis 602 includes a circuit board 604 having a (male) connector 624b. The connector 624b is configured to engage a (female) connector 624a on the electronic component 506. The connectors 624a, 624b are conventional connectors that, for example, provide only power to the electronic component 506 when inserted. The chassis 602 also includes the antenna 320 (of FIG. 3) positioned in the slot 628. The antenna 320 can be attached to the chassis 602 by, for example, adhesive to even further minimize the profile of the antenna 320. The antenna 320 can be thin enough to require only a small amount of space between the chassis 602 and the electronic component 506, such as a quarter-inch.

Referring now to FIG. 6B, the electronic component 506 is shown fully inserted into the slot 628 of the chassis 602 with the connectors 624a and 624b (both in FIG. 6A) engaged. When fully inserted into the slot 628, the RFID tag 422 on the electronic component 506 is aligned with the antenna 320 in the slot 628. In one or more embodiments, the alignment is an overlapping alignment, such as an overlapping vertical alignment with the RFID tag 422 directly above and overlapping the antenna 320. With the electronic component 506 arranged as shown in FIG. 6B, the RFID reader 618 can send an interrogation signal to the RFID tag 422 of the electronic component 506. The interrogation signal causes the RFID tag 422 to generate a response signal that contains information about the electronic component 506. The antenna 320 and RFID reader 618 can then receive the response signal and communicate the information to a controller (e.g., controller 214 of FIG. 2).

Referring back to FIG. 2, the asset identification component 216 can also be modified to include an RFID tag 222. The circuit board 204 can also include an RFID reader 218 and an antenna 220 configured to interrogate the RFID tag 222 of the asset identification component 216.

Figure 7:
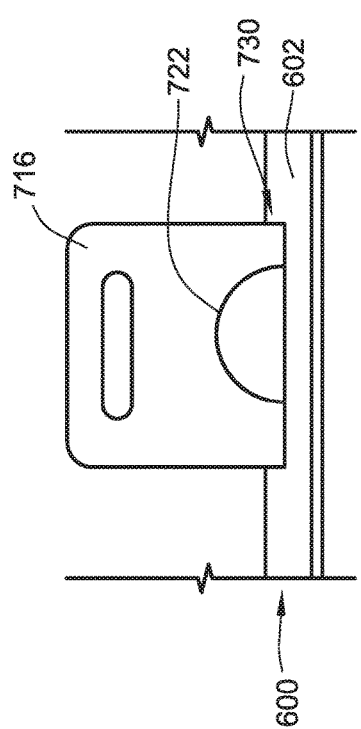
FIG. 7 illustrates an asset identification component partially inserted into the chassis of a server, in accordance with the various embodiments.

FIG. 7 illustrates an asset identification component 716 partially inserted into an aperture 730 within the chassis 602 of the server 600 (of FIGS. 6A and 6B). An RFID reader and antenna (or antenna alone) (e.g., RFID reader 218 and antenna 220 of FIG. 2) can be positioned at the aperture 730 and can interrogate the RFID tag 722 of the asset identification component 716 when the asset identification component 716 is inserted into the aperture 730. The RFID reader can then transmit information read from the RFID tag 722 of the asset identification component 716 to a controller (e.g., controller 214 of FIG. 2) for management of the asset identification component 716.

With the RFID tag 722 on the asset identification component 716, the asset identification component 716 can provide for enhanced asset identification. Although conventional asset identification components merely indicate, for example, the serial number of the server, the information read from the RFID tag 722 of the asset identification component 716 can provide additional information. The additional information can include, for example, the age, name, part number, serial number, MAC address, controller MAC address, manufacture date, device version, board version, platform name, open network install environment name, number of MAC addresses, manufacturer, country code, vendor, BIOS version, controller version, custom software version, PSU version, PSU vendor, AC input, and/or error code, for the server as a whole and for each respective component within the server.

The presence of the RFID tag 722 on the asset identification component 716 also does not prevent the asset identification component 716 from including the conventional optical indicia that can be read with an optical scanner. Thus, in one or more embodiments, the asset identification component 716 can include only the RFID tag 722; both the RFID tag 722 and a bar code; or some other conventional optical code for optical scanning.

Figure 8A:
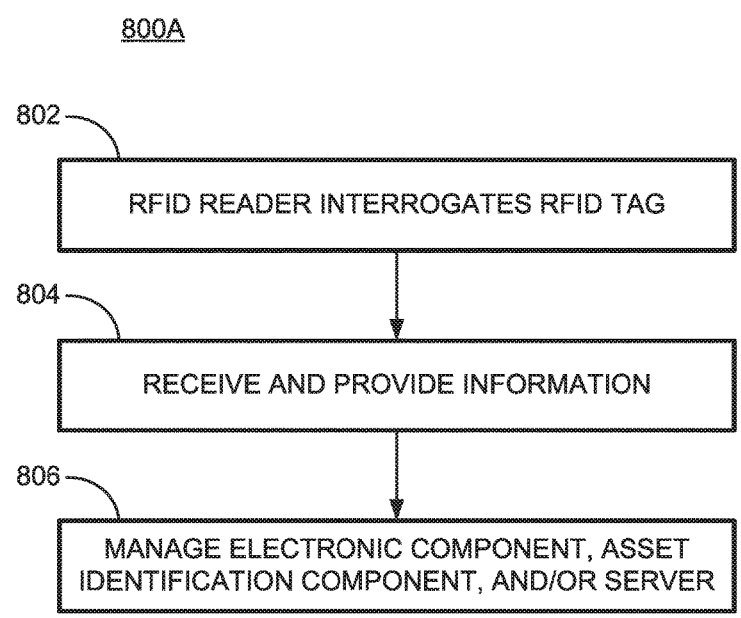
FIG. 8A illustrates an exemplary method for managing one or more removable electronic components within a server, in accordance with certain embodiments.

Referring now to FIG. 8A, there is shown an exemplary method 800A for managing one or more removable electronic components within a server, in accordance with certain embodiments. It should be understood that the exemplary method 800A is presented solely for illustrative purposes, and that other methods in accordance with the various embodiments can include additional, fewer, or alternative steps performed in similar or alternative orders, or in parallel.

The exemplary method 800A starts at step 802 with an RFID reader interrogating an RFID tag of a removable electronic component connected to a chassis of a server. In addition, or in the alternative, step 802 can include an RFID reader interrogating an RFID tag of an asset identification component inserted in a server, such as inserted within an aperture in the server.

In one or more embodiments, the interrogating can be continuous, periodic, on-demand, in response to insertion of the removable electronic component or asset identification component, or a combination thereof. Continuous interrogation can include the RFID reader constantly emitting an interrogation signal from an antenna. The periodic interrogation can include the RFID reader emitted an interrogation signal according to a set timing, such as every 10 seconds, 30 seconds, one minute, two minutes, five minutes, 10 minutes, or any other timing sequence, including non-uniform periods. The on-demand interrogation can include the RFID reader causing an interrogation signal to be emitted in response to a request from, for example, a controller, such as in response to a request triggered by a user of the server. The interrogation also can occur as a result of insertion of an electronic component or asset identification component within the chassis. For example, the chassis may include one or more sensors that activate upon the insertion of an electronic component or asset identification component. Activation of the sensor can then cause the RFID reader to interrogate the associated RFID tag.

At step 804, in response to the interrogating, the RFID reader receives information from the electronic component or assert identification component and provides the information to a controller of the server. As discussed above, the information can be one or more operating parameters that describe the current state of the electronic component associated with the interrogated RFID tag. In the case of a fan as an example, the information can include what direction the airflow is (e.g., front-to-back (FtB) or back-to-front (BtF), the fan rotor state, the fan location, etc.). The information can include any other type of information about the electronic component, such as a serial number, model number, part revision, Internet Protocol address, media access control address, model name, first run date, last run date, a runtime, a manufacture date, a manufacturer, or a combination thereof of the removable electronic component.

At step 806, the controller manages the removable electronic component, the asset identification component, the server, or a combination thereof based on the information provided in step 804. In one or more embodiments, the management process provided by the controller can be any conventional management process provided by, for example, a BMC based on the information retrieved. However, because the information retrieved is information from electronic components that previously cannot be provided to the controller, the management process provided by the controller can include management over components within the server that previously were not manageable without suffering from the drawbacks discussed above.

In one or more specific embodiments, the management process by the controller includes the controller causing a logging of the received information in an electronic database. The electronic database can be internal to the server, such a storage device within the server; or the electronic database can be external to the server, such as a remote server, a cloud-based storage system, and the like. In one or more embodiments, the controller can cause the logging of the information in multiple electronic databases, such as multiple external and/or internal electronic database relatives to the server.

In one or more embodiments, the management process can include the server providing the information to an electronic device for display of the information on a graphical user interface of the electronic device. The electronic device can be any type of computing device capable of displaying information, such as another server, a desktop, a laptop, a tablet, a mobile computing device, such as a smartphone, and the like. By way of example, the electronic device can be a terminal connected to the server, where the information is displayed on a display of terminal. Alternatively, or in addition, the electronic device can be a smartphone operated by a user of the server.

In addition to the server providing the information to an electronic device, the server (e.g., software running on the server or the controller) can also decode the information so that the information is in a more understandable format for a user of the electronic device. The decoding can include, for example, assigning text descriptor fields and values to the information.

Figure 9A:
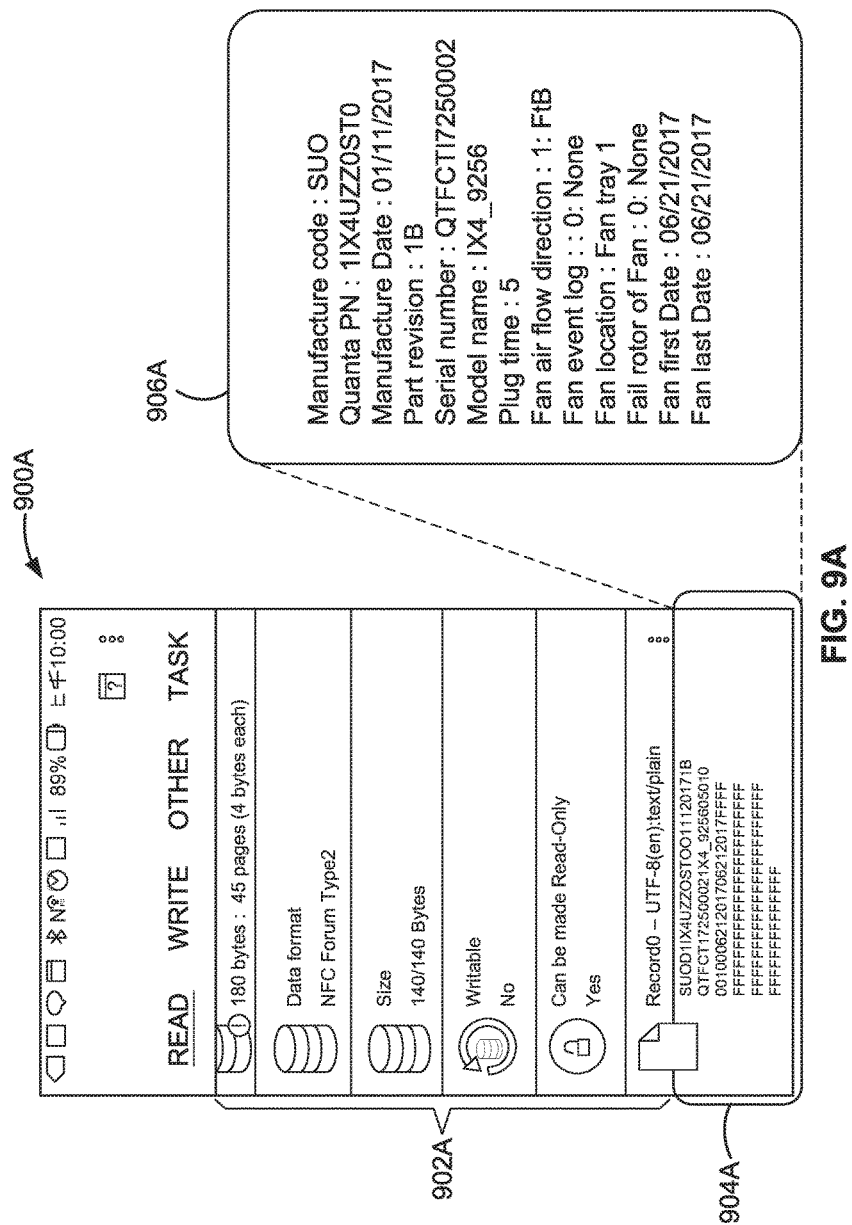
FIG. 9A illustrates an exemplary graphical user interface (GUI) presented on a display of an electronic device with information retrieved from an RFID tag of an electronic component, in accordance with the various embodiments.

FIG. 9A illustrates an example graphical user interface (GUI) 900A of a display of an electronic device presenting the information retrieved from an RFID tag of an electronic component, in accordance with the various embodiments. The GUI 900A includes portion 902A presenting data about the RFID tag itself, such as the data format, the storage size, whether the RFID tag is writable and/or capable of being made read-only, etc. Additionally, the GUI 900A includes portion 904A presenting the information from the RFID tag about an electronic component. The information shown in the portion 904A is not understandable by the user because, for example, the information may be encoded. As described above, the server can decode the information, and assign text descriptor fields and values to the information so that a user of the electronic device can understand the information from the RFID tag. The callout 906A includes the information presented in the descriptor fields and values format, which can replace the text within the portion 904A after decoding.

Figure 9B:
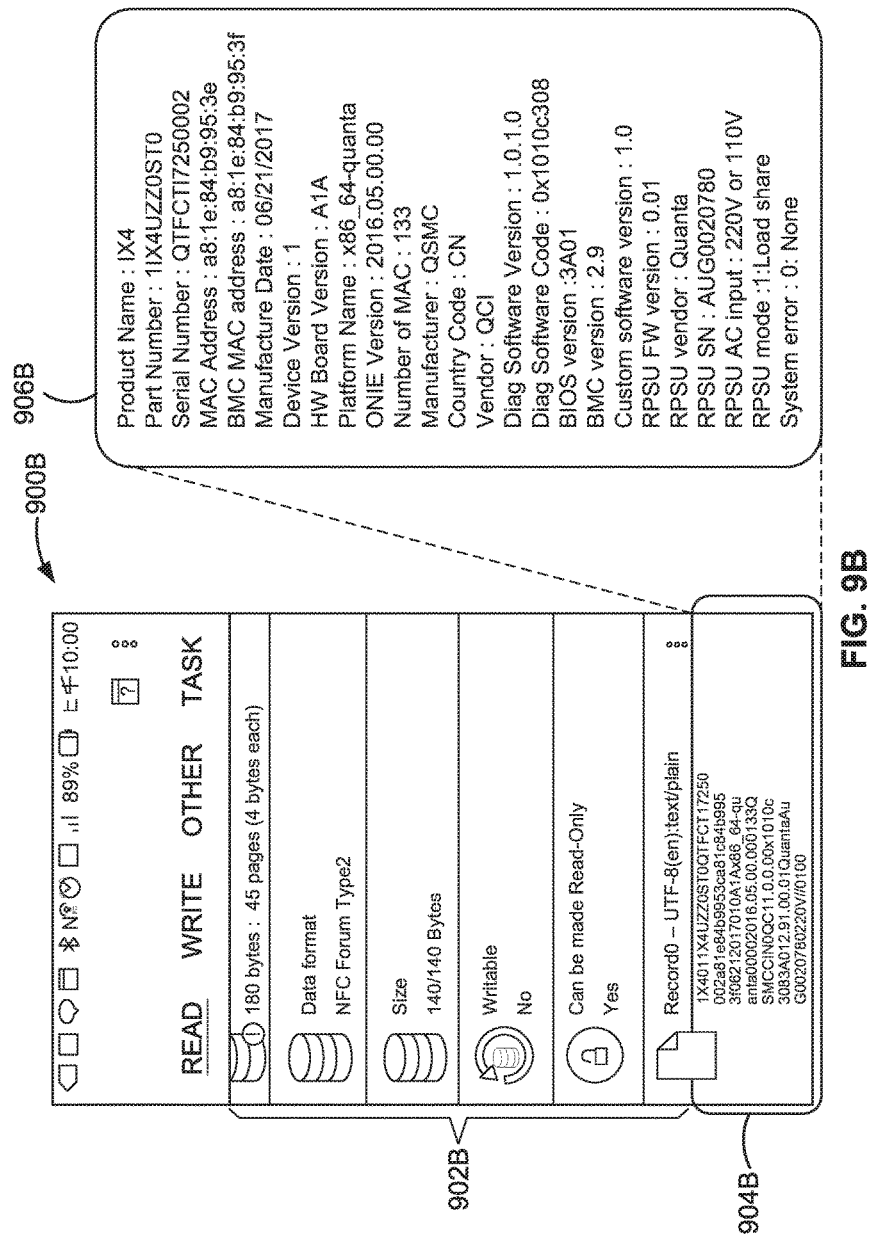
FIG. 9B illustrates an exemplary GUI presented on a display of an electronic device with information retrieved from an RFID tag of an asset identification component, in accordance with the various embodiments.

Similar to FIG. 9A, FIG. 9B illustrates an example GUI 900B of a display of an electronic device presenting the information retrieved from an RFID tag of an asset identification component, in accordance with the various embodiments. Like FIG. 9A, the GUI 900B includes portion 902B presenting data about the RFID tag itself, such as the data format, the storage size, whether the RFID tag is writable and/or capable of being made read-only, etc. Additionally, the GUI 900B includes portion 904B presenting the information from the RFID tag about the asset identification component. The information shown in the portion 904B is not understandable by the user because, for example, the information may be encoded. As described above, the server can decode the information, and assign text descriptor fields and values to the information so that a user of the electronic device can understand the information from the RFID tag. The callout 906B includes the information presented in the descriptor fields and values format that can replace the text within the portion 904B after decoding.

Referring back to step 806 of FIG. 8A, in one or more embodiments, the RFID reader can be an RFID transceiver that is capable of writing information to the RFID tag. With the RFID transceiver, the managing can include causing an update of the information on the RFID tag. In one or more embodiments, the updating can include changing values stored in memory within the RFID tag, such as changing the runtime stored on the RFID tag associated with the electronic component. In one or more embodiment, the updating can include changing the values stored in memory of the electronic component associated with the RFID tag, which in turn can change the operation of the electronic component. For example, the RFID transceiver can change the value for fan speed stored in the RFID tag or memory on the fan. The electronic component can be configured to detect the change in the RFID tag for the fan speed and make a corresponding fan-speed change. The same update can occur to an RFID tag of an asset identification component, as described further below.

Figure 8B:
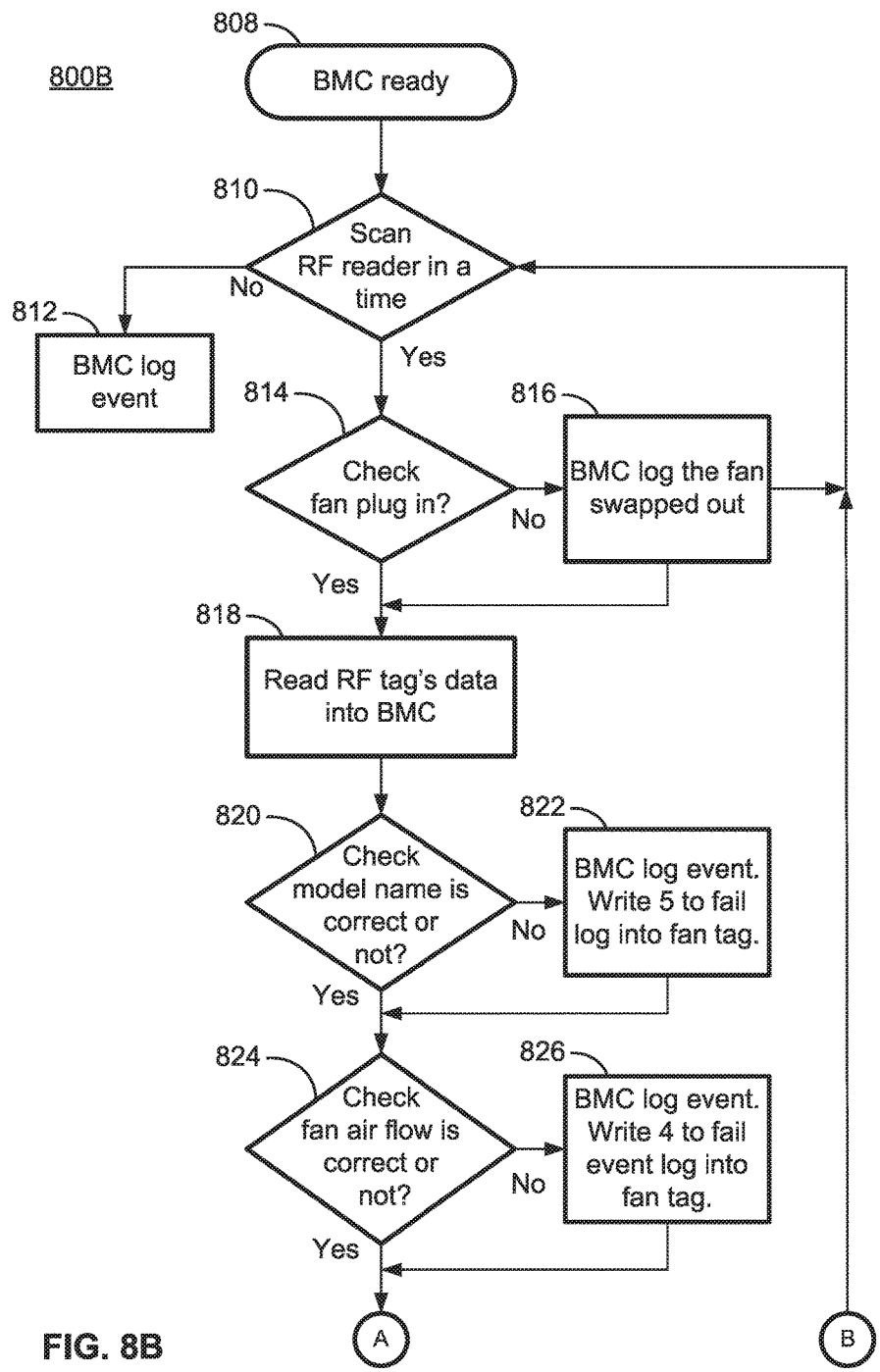
FIG. 8B illustrates an exemplary method for managing a hot-swappable fan as the electronic component within a server, in accordance with certain embodiments.
Figure 8B:
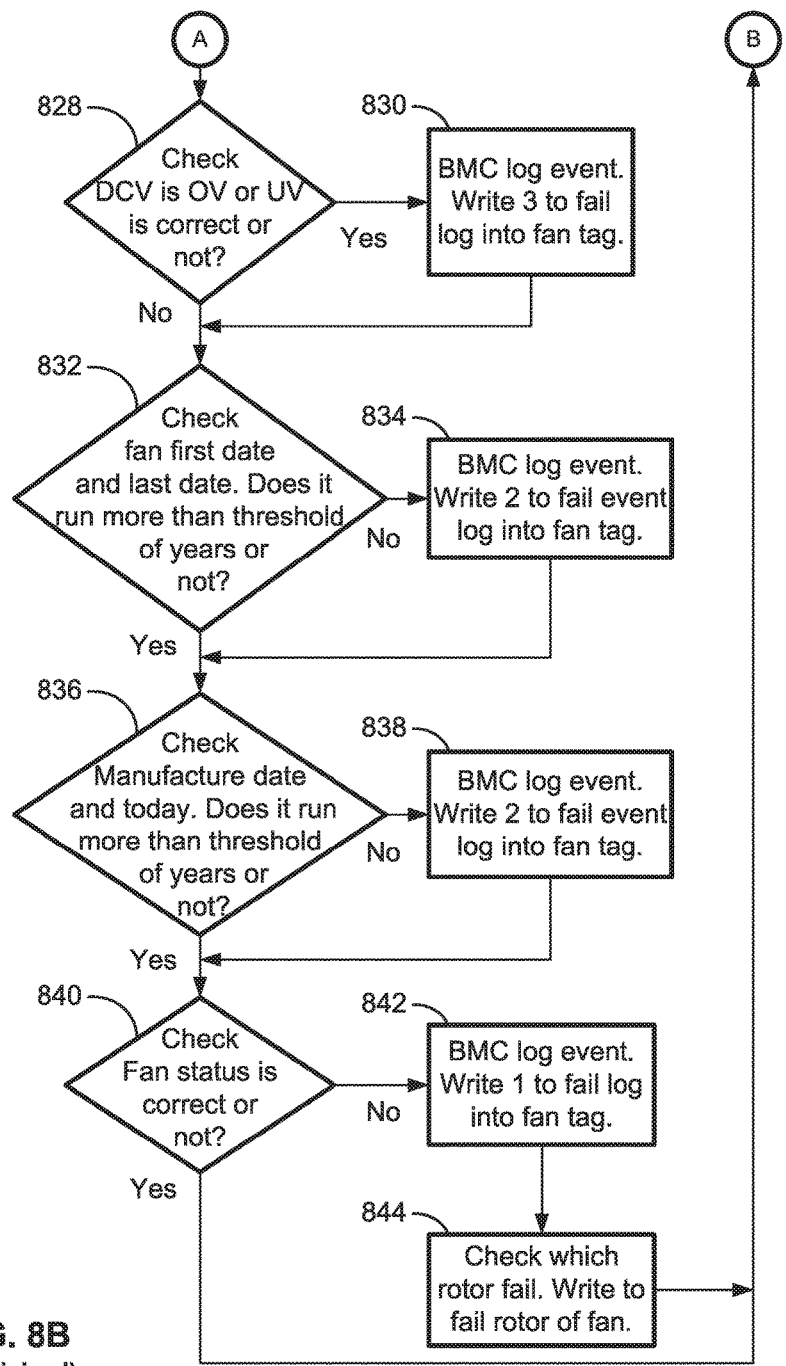

FIG. 8B illustrates an exemplary method 800B for managing a hot-swappable fan within a server, in accordance with the various embodiments. It should be understood that the exemplary method 800B is presented solely for illustrative purposes, and that in other methods in accordance with the various embodiments can include additional, fewer, or alternative steps performed in similar or alternative orders, or in parallel.

The exemplary method starts at step 808 where the controller (e.g., controller 214, such as a BMC) within a server (e.g., server 200) begins management over the removable electronic components within the server, including the fan. Step 808 can begin once the server boots up and begins running the BIOS and/or the operating system that controls the controller.

At step 810, the controller determines whether the RFID reader should scan for a present RFID tag. As discussed above, the controller can instruct the RFID reader to scan for an RFID tag continuously, periodically, on-demand, or in response to a signal being received that an electronic component has been inserted into a slot of the chassis of the server.

At step 812, in response to the controller determining not to instruct the RFID reader to scan for a present RFID tag, the RFID reader does not emit and interrogation signal. In one or more embodiments, the controller can log the event in one or more external, internal, or a combination thereof logs.

At step 814, in response to the controller determining to instruct the RFID reader to scan for a present RFID tag, the RFID reader emits an interrogation signal. In the case of a fan as the electronic component, the interrogation signal determines whether a fan is inserted into the chassis by waiting for a response signal from the RFID tag on the fan.

At step 816, in response to the interrogation signal, no response from an RFID tag of the fan is received. A determination is made by the controller that the fan has been swapped out or is not present. The controller then logs the determination into one or more logs and the process reverts back to step 810.

At step 818, in response to the interrogation signal, a response is received from the RFID tag of a fan inserted into the chassis. The response includes information from the RFID tag, such as one or more elements of the information discussed above, and as further described below. The RFID reader communicates the information to the controller upon receipt. Once the controller obtains the information, the controller can analyze the information for certain fields and/or values.

At step 820, the controller checks that the model name of the fan is correct. If the model name of the fan is not correct, the method proceeds to step 822. If the model name of the fan is correct, the method proceeds to step 824.

At step 822, the controller logs that the model name of the fan is incorrect. In the embodiment where the RFID reader is an RFID transceiver, the controller can cause the RFID transceiver to signal to the RFID tag to write a fail event in the log of the RFID tag. In one or more embodiments, the fail event written into the log can be specified as an incorrect model name. The method 800B then proceeds to step 824.

At step 824—either after the controller determines that the model name of the fan is correct, or after the controller logs the fail event of step 822 into the log and/or the RFID tag—the analysis of the received information continues to determining whether the fan airflow is correct. If the airflow is not correct, the method 800B proceeds to step 826. If the fan airflow is correct, the method 800B proceeds to step 828.

At step 826, the controller logs that the fan airflow is incorrect into the one or more logs. In the embodiment where the RFID reader is an RFID transceiver, the controller can cause the RFID transceiver to signal to the RFID tag to write a fail event in the log of the RFID tag. In one or more embodiments, the fail event written into the log can be specified as an incorrect fan airflow. The method 800B then proceeds to step 828.

At step 828—either after the controller determines that the fan airflow is correct, or after the controller logs the fail event of step 826 into the log and/or the RFID tag—the analysis of the received information continues to determining whether the direct current (DC) voltage is correct. If the DC voltage is not correct, the method 800B proceeds to step 830. If the DC voltage is correct, the method 800B proceeds to step 832.

At step 830, the controller logs that the DC voltage is incorrect into the one or more logs. In the embodiment where the RFID reader is an RFID transceiver, the controller can cause the RFID transceiver to signal to the RFID tag to write a fail event in the log of the RFID tag. In one or more embodiments, the fail event written into the log can be specified as an incorrect DC voltage. The method 800B then proceeds to step 832.

At step 832, the analysis of the received information proceeds to determining whether the runtime of the fan satisfies a threshold. The determination can occur, for example, by directly analyzing a runtime value if provided in the information. Alternatively, the determination can occur, for example, by the controller determining the difference between a last fan date and a first fan date. If the runtime does not satisfy the threshold (such as the runtime exceeding a limit), the method 800B proceeds to step 834. If the runtime satisfies the threshold, the method 800B proceeds to step 836.

At step 834, the controller logs that the runtime does not satisfy the threshold, such as exceeding a limit, into the one or more logs. In the embodiment where the RFID reader is an RFID transceiver, the controller can cause the RFID transceiver to signal to the RFID tag to write a fail event in the log of the RFID tag. In one or more embodiments, the fail event written into the log can be specified as exceeding the runtime. The method 800B then proceeds to step 836.

At step 836—either after the controller determines that the runtime satisfies the threshold, or after the controller logs the fail event of step 834 into the log and/or the RFID tag—the analysis of the received information continues to determining whether the lifetime of the fan satisfies a threshold. The determination can occur, for example, by directly analyzing a lifetime value if provided in the information. Alternatively, the determination can occur, for example, by the controller determining the difference between a current date and a manufacture date of the fan. If the lifetime does not satisfy the threshold (such as the lifetime exceeding a limit), then the method 800B proceeds to step 838. If the lifetime satisfies the threshold, then the method 800B proceeds to step 840.

At step 838, the controller logs that the lifetime does not satisfy the threshold, such as exceeding a limit, into the one or more logs. In the embodiment where the RFID reader is an RFID transceiver, the controller can cause the RFID transceiver to signal to the RFID tag to write a fail event in the log of the RFID tag. In one or more embodiments, the fail event written into the log can be specified as exceeding the lifetime. The method 800B then proceeds to step 840.

At step 840—either after the controller determines that the lifetime satisfies the threshold, or after the controller logs the fail event of step 838 into the log and/or the RFID tag—the analysis of the received information proceeds to determining whether the fan is operating correctly. For example, the determination of whether the fan is operating correctly can include checking a fan status field within the information. If the fan status field in the information indicates that the fan is operating correctly, the method 800B proceeds back to step 810. If the fan status field in the information indicates that the fan is not operating correctly, the method 800B proceeds to step 842.

At step 842, the controller logs that the fan is not operating correctly into the one or more logs. In the embodiment where the RFID reader is an RFID transceiver, the controller can cause the RFID transceiver to signal to the RFID tag to write a fail event in the log of the RFID tag. In one or more embodiments, the fail event written into the log can be specified as a fan failure. The method 800B then proceeds to step 844.

At step 844, the controller can check the information to determine the event that caused the fan to fail. By way of example, the information may include a fan rotor field that can specify which one of two or more fan rotors failed to cause the fan failure. The controller can then write to the logs and/or cause the RFID transceiver to write to the RFID tag the fan rotor that failed. The method then proceeds back to step 810.

The foregoing method 800B of FIG. 8B allows for management of the fan within the server despite the fan not having a connection to the controller via a PCBA. However, the management scheme using the radiofrequency communication and the RFID reader and tags can provide the same level of management without suffering from the drawbacks discussed above.

Figure 10:
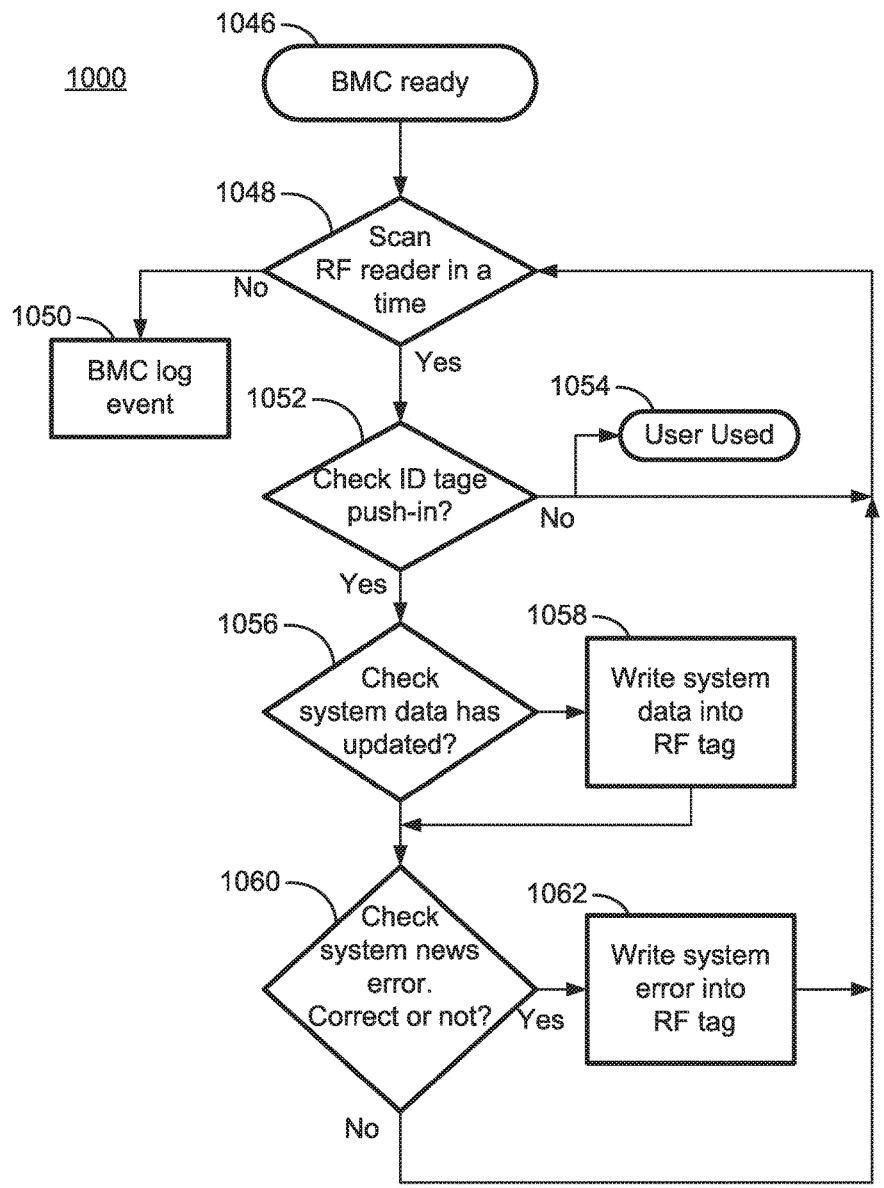
FIG. 10 illustrates an exemplary method for updating information on an asset identification component, in accordance with certain embodiments.

FIG. 10 illustrates an exemplary method 1000 for updating information on an asset identification component, in accordance with the various embodiments. It should be understood that the exemplary method 1000 is presented solely for illustrative purposes, and that in other methods in accordance with the various embodiments can include additional, fewer, or alternative steps performed in similar or alternative orders, or in parallel.

The exemplary method starts at step 1046 where the controller (e.g., controller 214 in FIG. 2, such as a BMC) within a server (e.g., server 200 in FIG. 2) begins management over the asset identification component (e.g., asset identification component 216 in FIG. 2) within the server. Step 1046 can begin once the server boots up and begins running the BIOS and/or the operating system that controls the controller.

At step 1048, the controller determines whether to instruct the RFID reader associated with the asset identification component to scan for a present RFID tag. As discussed above, the controller can determine to instruct the RFID reader to scan for an RFID tag continuously, periodically, on-demand, or in response to a signal being received that an asset identification component has been inserted into a slot of the chassis of the server.

At step 1050, in response to the controller determining that the timing is not correct to instruct the RFID reader to scan for a present RFID tag, the controller logs the event. The controller can log the event in one or more external, internal, or a combination thereof logs.

At step 1052, in response to the controller determining that the timing is correct to instruct the RFID reader to scan for a present RFID tag, the controller causes the RFID reader to emit an interrogation signal.

At step 1054, a determination is made that the asset identification component is not inserted into the chassis of the server because a response signal is not received from an RFID tag. For example, a user may be manually scanning the bar codes on the asset identification component and/or manually interrogating the RFID tag on the asset identification component with a hand-held RFID reader.

At step 1056, in response to the interrogation signal, a response is received from the RFID tag of the asset identification component inserted into the chassis. The response includes information from the RFID tag, such as information on the setup and configuration of the server within which the asset identification component is inserted. Also, the information is passed from the RFID reader to the controller upon receipt.

The controller then analyses the received information from the RFID reader. By way of example, step 1056 includes the controller checking the information to determine whether the information has been updated since the last scan, or needs to be updated since the last update the controller received. If the information on the asset identification component needs to be updated, the method 1000 proceeds to step 1058. If the information on the asset identification component is correct, the method proceeds to step 1060.

At step 1058, the controller causes the RFID reader, configured as an RFID transceiver, to write the updated information to the RFID tag. Once the information is written in the RFID tag, the method 1000 can proceed to step 1060.

At step 1060, the controller checks whether there currently are any error states of the one or more assets within the server. For example, if one or more fans have failed, there is a current error state of a fan failure. The controller may be aware of one or more error states by the controller previously instructing one or more other RFID readers to interrogate one or more other RFID tags associated with electronic components within the server. Alternatively, or in addition, the controller may be aware of one or more error states by the controller communicating through the connectors 112 with one or more active electronic components. The error states can be associated with any process or component managed by the controller. If there are error states, the method 1000 proceeds to step 1062. If there are no error states, the method 1000 proceeds back to step 1048.

At step 1062, the controller causes the RFID reader, configured as an RFID transceiver, to write the error states to the RFID tag of the asset identification component. Writing the error states to the asset identification component allows a user to subsequently scan the asset identification component, such as with a hand-held RFID reader, to read the information on the asset identification component, including the errors states. After the error states are written to the RFID tag of the asset component, the method 1000 proceeds back to step 1048.

The method 1000 allows for a dynamic update to the information contained on an asset identification component. Thus, unlike conventional asset identification components that include only fixed visible indicia, the asset identification components accordance with the various embodiments can be updated as information pertaining to the server associated with the asset identification component is updated. Such dynamically modifiable asset identification components provide for greater flexibility and management options within servers.

Although the management discussed herein is primarily directed to that of passive electronic components using radiofrequency communication, the same management can be provided to active electronic components with the addition of RFID readers, antennas, and RFID tags as described above with respect to FIG. 2 for the active electronic components. Thus, the various embodiments can be applied to any electronic component within a server.

The various illustrative logical blocks, modules, and circuits described in connection with the various embodiments herein can be implemented or performed with a general-purpose processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general-purpose processor can be a microprocessor, but in the alternative, the processor can be any conventional processor, controller, microcontroller, or state machine. A processor can also be implemented as a combination of computing devices, e.g., a combination of a DSP and a microprocessor; a plurality of microprocessors; one or more microprocessors in conjunction with a DSP core; or any other such configuration.

The operations of a method or algorithm described in connection with the various embodiments can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

In one or more exemplary designs, the functions described can be implemented in hardware, software, firmware, or any combination thereof. If implemented in software, the functions can be stored on or transmitted over as one or more instructions or code on a non-transitory computer-readable medium. Non-transitory computer-readable media includes both computer storage media and communication media including any medium that facilitates transfer of a computer program from one place to another. A storage media can be any available media that can be accessed by a general purpose or special purpose computer. By way of example, and not limitation, such computer-readable media can include RAM, ROM, EEPROM, CD-ROM, or other optical disk storage; magnetic disk storage or other magnetic storage devices; or any other medium that can be used to carry or store desired program code means in the form of instructions or data structures, and that can be accessed by a general-purpose or special-purpose computer, or a general-purpose, or a special-purpose processor. Disk and disc, as used herein, include compact disc (CD), laser disc, optical disc, digital versatile disc (DVD), floppy disk, and blue ray disc where disks usually reproduce data magnetically, while discs reproduce data optically with lasers. Combinations of the above should also be included within the scope of non-transitory computer-readable media.

While various embodiments have been described above, it should be understood that they have been presented by way of example only, and not limitation. Numerous changes to the disclosed embodiments can be made in accordance with the disclosure herein without departing from the spirit or scope. Thus, the breadth and scope of the present disclosure should not be limited by any of the above described embodiments. Rather, the scope of the present disclosure should be defined in accordance with the following claims and their equivalents.

Although the various embodiments have been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a", "an", and 'the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A server comprising:
a chassis comprising a plurality of slots, each slot of the plurality of slots being configured to connect a removable electronic component to the chassis;
a controller configured to manage utilization of the removable electronic components within the server, and serve as an interface between the removable electronic components and an operating system of the server; and
at least one RFID reader and an optical scanner communicatively connected to the controller, the at least one RFID reader being configured to interrogate one or more RFID tags of the removable electronic components connected to the chassis, and provide information from the one or more RFID tags to the controller, and the optical scanner configured to read one or more bar codes of the removable electronic components.

2. The server of claim 1, wherein the at least one RFID reader comprises a plurality of RFID readers, and each RFID reader of the plurality of RFID readers is associated with a separate slot of the plurality of slots.

3. The server of claim 2, further comprising:
a plurality of antennas communicatively connected to the plurality of RFID readers,
wherein each antenna of the plurality of antennas is connected to a separate RFID reader of the plurality of RFID readers.

4. The server of claim 3, wherein each antenna of the plurality of antennas is positioned at a separate slot of the plurality of slots to be in alignment with the RFID tag of the electronic component connected to the separate slot.

5. The server of claim 1, wherein the chassis includes an aperture configured to accept insertion of an asset identification component, the at least one RFID reader being configured to interrogate an RFID tag of the asset identification component with the asset identification component inserted into the aperture.

6. The server of claim 5, further comprising:
at least one antenna communicatively connected to the at least one RFID reader,
wherein the at least one antenna is positioned to be in alignment with the RFID tag of the asset identification component with the asset identification component inserted into the aperture.

7. The server of claim 1, wherein the at least one RFID reader is at least one RFID transceiver configured to provide information from the controller to the one or more RFID tags.

8. A server comprising:
a chassis comprising a plurality of slots;
a plurality of removable electronic components, each removable electronic component of the plurality of removable electronic components being inserted into a separate slot of the plurality of slots to connect the removable electronic component to the chassis and including an RFID tag;
a controller configured to manage utilization of the removable electronic components within the server and serve as an interface between the removable electronic components and an operating system of the server; and
a plurality of RFID readers and an optical scanner communicatively connected to the controller, each RFID reader of the plurality of RFID readers being configured to interrogate a separate RFID tag of a separate removable electronic component of the plurality of electronic components and provide retrieved information from the separate RFID tag to the controller, and the optical scanner configured to read one or more bar codes of the removable electronic components.

9. The server of claim 8, wherein the plurality of RFID readers is a plurality of RFID transceivers configured to provide information from the controller to the plurality of RFID tags of the plurality of removable electronic components.

10. The server of claim 9, further comprising:
an aperture within the chassis configured to accept an asset identification component,
wherein at least one RFID transceiver of the plurality of RFID transceiver is configured to interrogate an RFID tag of the asset identification component and provide information from the RFID tag of the asset identification component to the controller.

11. The server of claim 10, wherein the at least one RFID transceiver is configured to write information from the controller in the RFID tag of the asset identification component.

12. A method for managing one or more removable electronic components within a server, the method comprising:
interrogating, with an RFID reader, an RFID tag of a removable electronic component of the one or more removable electronic components connected to a chassis of the server;
receiving, in response to the first interrogating, first information from the electronic component and providing, by the RFID reader, the first information to a controller of the server;
interrogating, with an optical scanner, one or more bar codes of the removable electronic component of the one or more removable electronic components connected to the chassis of the server;
receiving, in response to the second interrogating, second information from the electronic component and providing, by the optical scanner, the second information to the controller of the server; and
managing, by the controller, the removable electronic component, the server, or a combination thereof based on the first information and the second information.

13. The method of claim 12, wherein the RFID reader is an RFID transceiver, and the managing of the removable electronic component includes causing an update to the first information on the RFID tag.

14. The method of claim 12, wherein the managing comprises the controller causes a logging of the first information in an electronic database external, internal, or a combination thereof to the server.

15. The method of claim 12, wherein the managing comprises providing, by the server, the first information for display on a graphical user interface of an electronic device.

16. The method of claim 15, wherein the managing comprises decoding the first information for display on the graphical user interface, and the electronic device is a mobile electronic device.

17. The method of claim 12, wherein the interrogating is continuous, periodic, on-demand, in response to insertion of the removable electronic component, or a combination thereof.

18. The method of claim 12, wherein the first information includes one or more operating parameters of the removable electronic component.

19. The method of claim 18, wherein the first information also includes a serial number, a model number, a part revision, an Internet Protocol address, a media access control address, a model name, a first run date, a last run date, a runtime, a manufacture date, a manufacturer, or a combination thereof of the removable electronic component.

20. The method of claim 12, wherein the RFID reader is an RFID transceiver, the method further comprising:
- interrogating, with the RFID transceiver, an RFID tag of an asset identification component inserted into the server; and
- causing an update of the RFID tag of the asset identification component based on the first information by providing the first information to the asset identification component.

* * * * *